United States Patent [19]

Fujii

[11] Patent Number: 4,654,689
[45] Date of Patent: Mar. 31, 1987

[54] STRUCTURE OF POWER SUPPLY WIRINGS IN SEMICONDUCTOR INTEGRATED CIRCUIT

[75] Inventor: Takeo Fujii, Tokyo, Japan
[73] Assignee: NEC Corporation, Japan
[21] Appl. No.: 711,794
[22] Filed: Mar. 14, 1985

[30] Foreign Application Priority Data

Mar. 14, 1984 [JP] Japan .................................. 59-48718

[51] Int. Cl.[4] .......................................... H01L 27/02
[52] U.S. Cl. ....................................... 357/51; 357/40; 357/68; 357/45
[58] Field of Search ................... 357/45, 51, 71, 71 R, 357/40, 65, 68, 59 T, 59 R

[56] References Cited

U.S. PATENT DOCUMENTS 4,168,442  9/1979  Satou et al. ........................ 357/42 X
4,454,529  6/1984  Philofsky et al. ................. 357/51 X
4,553,050  11/1985  Feinberg et al. ................. 357/51 X Primary Examiner—Martin H. Edlow
Assistant Examiner—Sara W. Crane
Attorney, Agent, or Firm—Sughrue, Mion, Zinn, Macpeak and Seas

[57] ABSTRACT

A semiconductor device comprises a first circuit section positioned in a center portion of the substrate, a second circuit section provided in the peripheral portion of the substrate, and first to third power supply main wiring layers on the substrate. The first wiring layer supplies a first voltage such as ground potential to the second circuit section. The second wiring layer supplies a second voltage such as Vcc potential to the second circuit section. The third wiring layer supplies the first voltage to the first circuit section. The device further comprises a MOS type capacitor having upper and lower electrodes. The upper electrode of the capacitor is connected to the second wiring layer, and the lower electrode of the capacitor is connected at its end parts to the first and third wiring layers such that both wiring layers are electrically connected each other. Such a device can decrease the surge current induced in the wiring layers by the capacitor. Further, signal lines can be continuously formed with low electrical resistance on an insulating layer above the capacitor. Therefore, the access time of the device can be reduced.

14 Claims, 13 Drawing Figures

STRUCTURE OF POWER SUPPLY WIRINGS IN SEMICONDUCTOR INTEGRATED CIRCUIT

BACKGROUND OF THE INVENTION

The present invention relates to an improved structure of power supply wirings in a semiconductor integrated circuit device.

A semiconductor integrated circuit device is usually supplied with at least two D.C. power supply voltages of, e.g., Vcc and ground potential. These voltages are applied to electrode pads provided on a semiconductor chip, or substrate, of the integrated circuit device and transmitted to respective circuits within the chip through respective power supply wiring layers formed on the chip. A power supply wiring is composed of two or more main wiring layers having a broader width, one of which runs along the edge or edges of the chip for the circuits (e.g. clock generator circuits and input and output circuits in case of a memory device) provided at the peripheral portions of the chip, the other running in the center portion of the chip for the circuits (e.g. a plurality of memory cells arranged in a matrix shape and decoder circuits in case of the memory device) provided at the center portion, and branch wiring layers having a narrower width and connected between the main wiring layers and circuit element in the respective circuits. The electrode pad, or the bonding pad, is connected to a predetermined portion of the main wiring layer, and a bonding wire is bonded to the bonding pad. Since the respective circuits require both of the two D.C. power supply voltages, four main wiring layers often run in parallel. The first main wiring layer is positioned in the most outer peripheral area, or nearest the edge of the chip, to supply the ground potential to the circuits at the peripheral portions. The second main wiring layer is positioned inner the first layer to supply the Vcc potential to the circuits at the peripheral portions. The third and fourth main layer are positioned inner the second layer to supply the ground potential and Vcc potential to the circuits at the central portions, respectively. Further a plurality of signal wiring layers such as clock signal lines, data signal lines, and address signal lines extend in the gap space of the main wiring layers. The main wiring layers and the signal wiring layers are at the same level and made of a metallic film such as an aluminum film to reduce the electrical resistance. Namely, these wiring layers are simultaneously formed by patterning an aluminum film of 1.2 μm thickness, for example, at the same process step.

In the conventional semiconductor device, the first and third main wiring layers for supplying the ground potential are electrically connected with a bridging wiring layer which is made of aluminum at the same level as the main wiring layer and has a broader width as that of the main wiring layer. Therefore, the second main wiring layer and signal wiring layers must be cut away at the bridging wiring layer and must be connected to each other with a polycrystalline wiring layer at a different level or with a diffusion layer in the chip underneath the bridging wiring layer. Namely, the so-called "tunnel wiring structure" must be provided for the signal line, and therefore, the resistance of the signal line becomes large. In practice, the bridging wiring layer has about 30 μm width, and accordingly, the length of the polycrystalline or diffusion wiring layer is more than 30 μm. Therefore, the resistance of the signal line becomes several hundreds ohms at this portion. In the recent very large scale integrated circuit device, the load capacitance of the signal line has been enhanced to about several ten picofarads (pF), for example. In this case, if the resistance of the signal line is one kilo-ohms (KΩ), the time constant becomes a large value such as several ten nano seconds (n sec), and also the value of the access time become long. The value must be decreased by reducing the resistance of the signal line. Therefore, it is necessary to eliminate the above mentioned tunnel wiring structure from the signal line.

On the other hand, in the recent VLSI device, a large surge current such as several hundreds milliamperes (mA) in peak value at ten nano-seconds (n sec) is apt to flow and induces an inverse voltage in the ground line by inductances of bonding wires and leads of the package. Therefore, the ground potential line would be elevated, in the extreme case, by 0.6 to 1.0 volt (V). This phenomenon causes error operation such as multi select phenomenon in the decoder circuit and restricts a high speed operation.

SUMMARY OF THE INVENTION

Therefore, one object of the present invention is to provide an effective semiconductor integrated circuit device in which the signal line has the low electrical resistance and a normal operation can be expected by suppressing the surge current or decreasing the peak value of the surge current.

According to one feature of the present invention, there is provided a semiconductor device comprising a semiconductor substrate, a first power supply wiring layer for supplying a first power supply voltage to circuits at the peripheral portion of the substrate, a second power supply wiring layer for supplying a second power supply voltage to the circuits at the peripheral portion of substrate, running on the inner side of the first power supply wiring layer and extending substantially in parallel with the first power supply wiring layer, a third power supply wiring layer for supplying the first voltage to circuits at the central portion of the substrate and running on the inner side of the second power supply wiring layer, a first enlarged conductive layer for electrically connecting the first and third power supply wiring layers and positioned under the second power supply wiring layer and having a predetermined area, a second enlarged conductive layer provided under the second power supply wiring layer, an insulating film positioned between the first and second enlarged conductive layers so as to form a capacitor with the first and second enlarged conductive layers, first means for electrically connecting the first and third power supply wiring layers to the first enlarged conductive layer, a second means for electrically connecting the second power supply wiring layer to the second enlarged conductive layer, and signal lines extending on the substrate between the first and third power supply wiring layers and above the first and second enlarged conductive layers.

According to another feature of the present invention, there is provided a semiconductor device comprising a semiconductor substrate, a first circuit section positioned in a center portion of the substrate, a second circuit section provided in the peripheral portion of the substrate, a first power supply wiring layer for supplying a first voltage such as ground potential to the second circuit section and running along the peripheral edge of the substrate, a second power supply wiring layer for supplying the first voltage to the first circuit section and extending on the first circuit section, a third power supply wiring layer for supplying a second voltage such as Vcc voltage to the second circuit section and/or the first circuit section, a MOS type capacitor having a first electrode, a second electrode and a dielectric film between the first and second electrodes, the first electrode being electrically connected to both the first and second power supply wiring layers and the second electrode being electrically connected to the third power supply wiring layer, an insulating layer provided under the first, second and third power supply wiring layers and above the MOS capacitor, and at least one signal line formed on the insulating layer above the MOS capacitor.

Such a device can decrease the surge current by the capacitor. Moreover, the connecting means or the MOS capacitor, which connects the power supply wiring layers, is covered with the insulating layer, and therefore the signal line need not be cut away, with maintaining a low electrical resistance and a high speed of signal transmission therethrough.

The description of the prior art and embodiments of the invention is made hereinafter with a memory device as an example of semiconductor integrated circuit devices.

DESCRIPTION OF THE PRIOR ART

Figure 1:
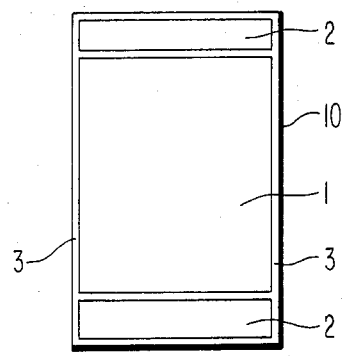
FIG. 1 is a plan view showing an outline of a semiconductor memory device.
Figure 2:
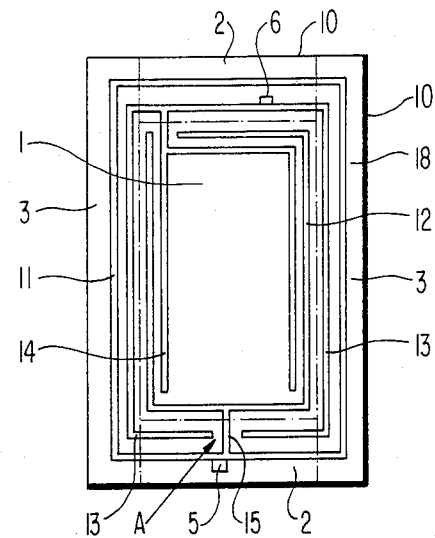
FIG. 2 and FIG. 3 are plan views showing semiconductor memory devices, respectively in the prior art.
Figure 3:
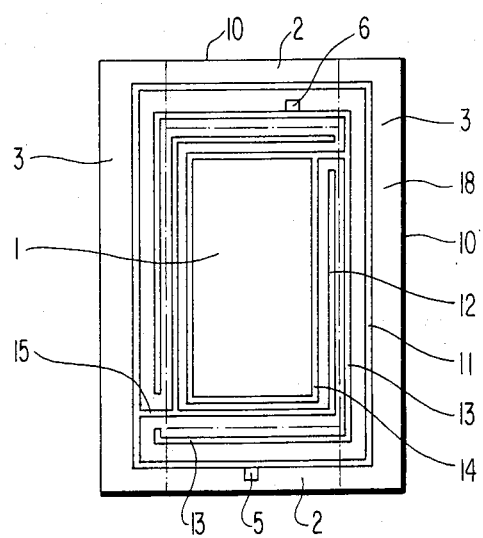
Figure 4:
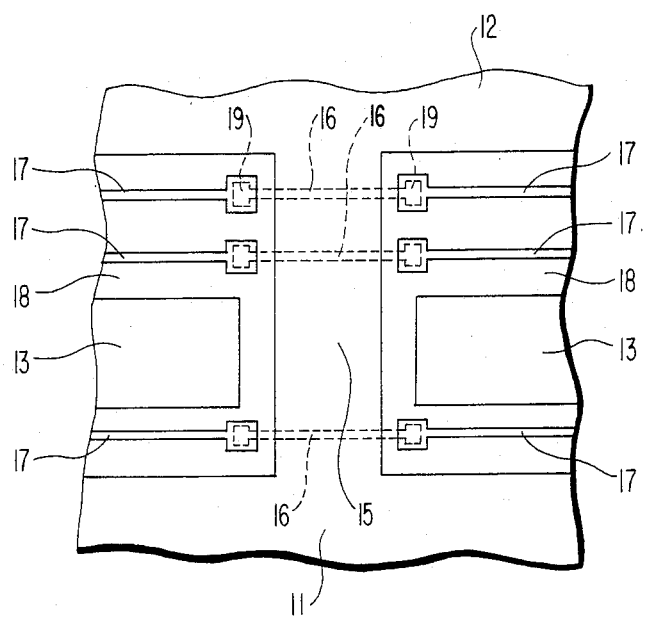
FIG. 4 is an enlarged plan view showing a portion A of FIG. 2.

Referring to FIGS. 1 to 3, in a semiconductor substrate 10, that is, semiconductor chip, a memory array section 1 including a plurality of memory cell such as one-transistor type memory cells and decoder circuits is positioned at a center portion of the substrate 10, and two peripheral circuit sections 2 including clock generator circuits, input and output circuits, etc. are positioned on the opposite sides each other of the memory array section 1. Further, two of wiring forming areas 3 are provided at left and right sides of the memory array section 1. Namely, the memory array section 1 is surrounded by the peripheral circuit section 2 and the wiring forming areas 3. In FIGS. 2 and 3, these sections and regions are delineated by phantom lines. A first main wiring layer 11 for supplying a first voltage such as ground potential to the peripheral circuit section 2 and a second main wiring layer 12 for supplying the first voltage to the memory array section 1 are formed on an insulating film 18 and extend in a peripheral portion of the substrate such that they substantially surround the memory array section 1. Also, a third main wiring layer 13 for supplying a second voltage such as positive Vcc potential to the peripheral circuit sections 2 and a fourth main wiring layer 14 for supplying the second voltage to the memory array section 1 are formed on the insulating film 18 and extend in the peripheral portion of the substrate. The third main wiring layer 13 may supply the second voltage to the memory array section 1. These main wiring layers for D.C. power supply has a broader width, for example, of 30 μm width and many branch wiring layers (not shown) having a narrower width are connected to respective main wiring layers and respective elements of the circuits. Bonding pads 5 and 6 are connected to the first and third main wiring layers 11 and 13, respectively, and the first and second voltages are applied through the bonding pads 5 and 6. Further, the first and second main wiring layers are connected to each other to reduce electrical resistance thereof by a bridging wiring layer 15 which is made of the same level metallic material, for example aluminum, as the main wiring layer and has a broader width as that of the main wiring layer. On the other hand, a plurality of signal lines 17 having 4 μm width and made of the same level aluminum are extended between the first and third main wiring layers 11 and 13 and between the third and second main wiring layers 13 and 12 as shown in FIG. 4. The signal line 17 must employ tunnel wiring structure by forming polycrystalline 16 or impurity diffusion wirings 16 under the bridging wiring layer 15 and connecting the signal lines 17 to the under wiring 16 at respective contact portions 19. In view of the length of the wiring 16 being 30 μm or more, the resistance of the signal line becomes a large value at this portion. Therefore, it cannot be expected to shorten the access time as mentioned above.

Moreover, in the prior art, any capacitor is not provided between the first, second main wiring layers to which the first voltage is applied and the third, fourth main wiring layers to which the second voltage is applied. Therefore, large surge current is apt to flow and a high reliable operation cannot be expected.

DESCRIPTION OF THE EMBODIMENT

In FIGS. 5 to 8, those parts having the same functions as those of FIGS. 1 to 4 are indicated by the same reference numerals.

Figure 5:
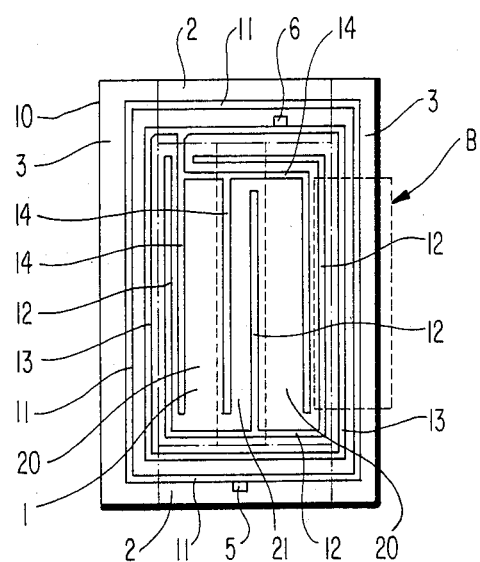
FIG. 5 is a plan view of an embodiment of the present invention.
Figure 6A:
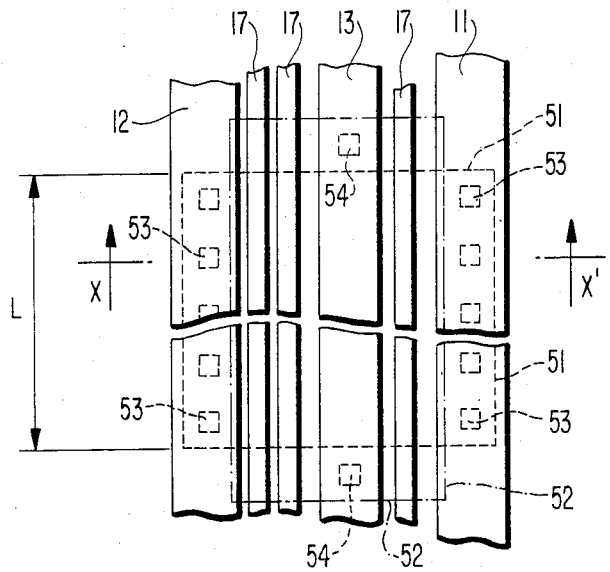
FIG. 6A is an enlarged plan view showing a portion B of FIG. 5.
Figure 6B:
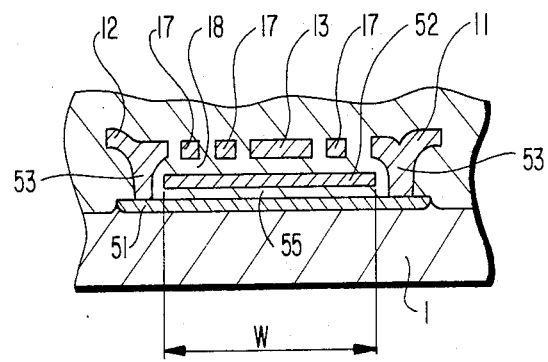
FIG. 6B is a cross-sectional view of FIG. 6A taking along the line X-X' and viewed in the direction of arrows.
Figure 7A:
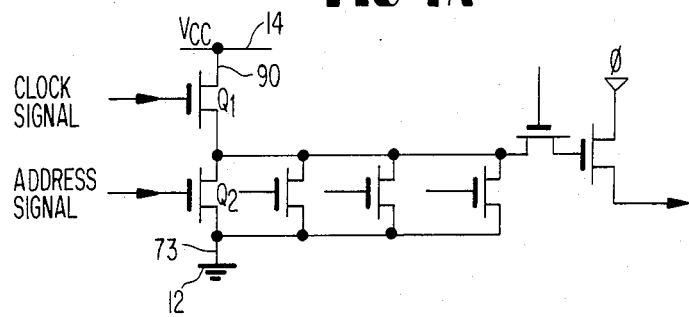
FIG. 7A is a circuit diagram showing a conventional decoder circuit in a memory array section.
Figure 7C:
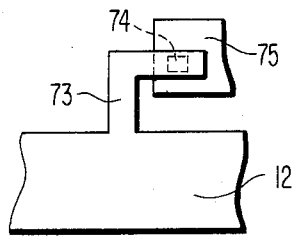
FIG. 7B and FIG. 7C are partial plan views of FIG. 7A, respectively.
Figure 7B:
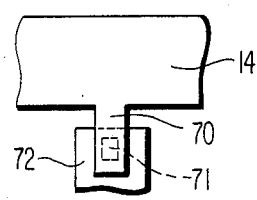
Figure 8A:
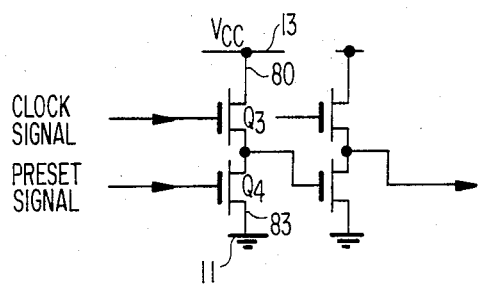
FIG. 8A is a circuit diagram showing partially a conventional clock generator in a peripheral circuit section.
Figure 8C:
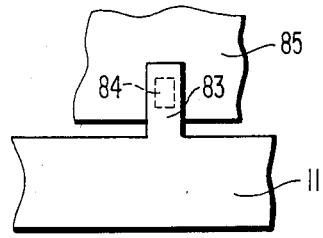
FIG. 8B and FIG. 8C are partial plan view of FIG. 8A.
Figure 8B:
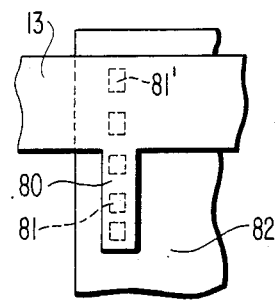

As shown in FIG. 5, the bridging wiring layer 15 in the prior art is taken off, and therefor a new connecting structure shown in FIGS. 6A and 6B is provided. The memory array section 1 in FIG. 5 shows that a decoder circuit part 21 is positioned in its center and at its left and right sides memory cell arranged parts 20 are positioned, respectively. Further, the second main wiring layer 12 for the first voltage and the fourth main wiring layer 14 for the second voltage are extended into the decoder circuit part 21.

Returning to FIGS. 6A and 6B, an N-type impurity region 51 having the sheet resistance of 30Ω/□ and the length L of 6 mm is formed in the P-type substrate 1. The first and second main wiring layers 11 and 12 for the first voltage such as ground potential are contacted to the impurity region 51 through contact holes 53 provided in the insulating layer 18, and then both wiring layers are electrically connected with each other. A thermal silicon di-oxide film 55 of 300 to 400 Å is formed on the impurity region, and a doped polycrystalline plate 52 having about 200 μm width W is provided on the silicon di-oxide film 55. The third main wiring layer 13 for the second voltage such as Vcc voltage is contacted to the doped polycrystalline plate 52 through contact holes 54 provided in the insulating layer 18. The capacitance formed by the silicon plate 52, the silicon di-oxide film 55 and the impurity region 51 becomes 1500 to 2000 pF. Therefore, the peak current of about 250 mA in the prior art can be reduced, for example, to about 180 mA by the capacitor. Moreover signal lines 17 of aluminum are continuously formed over the connecting structure of the present invention. Therefore, the access time can be shortened. Moreover, it is to be noted that the majority part of the MOS type capacitor mentioned above is formed in the wiring forming area, that is, field region, and therefore even if such a large capacitor is formed, the integration of the device never be sacrificed. Further, the capacitor can be formed by using multi polycrystalline layers. Namely, the impurity region can be replaced to another level silicon layer. Moreover, in FIG. 6, the wiring layers 11, 12 can be connected to the silicon plate 52, and therefor the wiring layer 13 is connected to the impurity region 51. In the embodiment, first to fourth main wiring layers and signal lines are simultaneously formed by patterning an aluminum film of 1.0 to 1.2 thickness, for example, deposited on the insulating layer 18 through a same process step.

The main wiring layers mentioned above can supply power voltages to elements through branch wiring layers, or else can directly supply. In a decoder circuit shown in FIG. 7, the branch wiring layer 70 of 5 μm width is connected to the source or drain region 72 of transistor $Q_1$ at its contact portion 71, and Vcc potential is applied from the main wiring layer 14 of 30 μm width through the branch wiring layer 70. Also, the branch wiring layer 73 is connected to the source or drain region 75 of transistor $Q_2$ at its contact portion 74, and ground potential is applied from the main wiring layer 12 through the branch wiring layer 73. In the clock generator shown in FIG. 8, the source or drain region 82 of transistor $Q_3$ is applied $V_{cc}$ potential from the main wiring layer 13 directly at contact portions 81' and through the branch wiring layer 80 at contact portions 81. To the source or drain region 85 of transistor $Q_4$ ground potential is applied from the main wiring layer 11 of broader width through the branch wiring layer 83 of narrower width at its contact portion 84. Such a branch wiring layer may be made of the same conductive material as that of the main wiring layers and may be formed with the main wiring layers with the same process step.

What is claimed is:

1. A semiconductor device comprising a semiconductor substrate, a first circuit section positioned in a center portion of said substrate, a second circuit section provided in the peripheral portion of said substrate, a first power supply wiring layer for supplying a first voltage to said second circuit section and running along a peripheral edge of said substrate, a second power supply wiring layer for supplying said first voltage to said first circuit section and extending on said first circuit section, a third power supply wiring layer for supplying a second voltage to said second circuit section and/or said first circuit section, said third power supply wiring layer running between said first and second power supply wiring layers and having a predetermined width, a MOS type capacitor having a first electrode, a second electrode and a dielectric film between said first and second electrodes, the first electrode being electrically connected to both said first and second power supply wiring layers and said second electrode being electrically connected to said third power supply wiring layer and having a width greater than said predetermined width, an insulating layer provided under said first, second and third power supply wiring layers and above said MOS capacitor, and at least one signal line formed on said insulating layer above said MOS capacitor.

2. A device of claim 1, in which said first electrode of said MOS type capacitor is an impurity region of one conductivity type formed in a portion of the opposite conductivity type of the substrate.

3. A device of claim 1, in which said second electrode of said MOS type capacitor is a polycrystalline silicon plate.

4. A device of claim 1, in which said first voltage is ground potential, and said second voltage is Vcc potential.

5. A device of claim 1, in which said first to third power supply wiring layers and said signal line are made of same conductive material.

6. A device of claim 5, in which said material is aluminum.

7. A semiconductor device comprising a semiconductor substrate having four edge lines, a first power supply wiring layer for supplying a first power supply voltage to circuits at the peripheral portion of said substrate running along said four edge lines of said substrate to form a ring shape in the plan view, a second power supply wiring layer for supplying a second power supply voltage to said circuits at said peripheral portion of said substrate, running on the inner side of said first power supply wiring layer and extending substantially in parallel with said first power supply wiring layer to form a closed shape in the plan view, a third power supply wiring layer for supplying said first voltage to circuits at a central portion of said substrate and running on the inner side of said second power supply wiring layer, a first enlarged conductive layer for electrically connecting said first and third power supply wiring layers and positioned under said second power supply wiring layer and having a predetermined area, a second enlarged conductive layer provided under said second power supply wiring layer, an insulating film positioned between said first and second enlarged conductive layers so as to form a capacitor with said first and second enlarged conductive layers, first means for electrically connecting said first and third power supply wiring layers to said first enlarged conductive layer, a second means for electrically connecting said second power supply wiring layer to said second enlarged conductive layer, and signal lines extending on said substrate between said first and third power supply wiring layers and above said first and second enlarged conductive layers.

8. A device of claim 7, in which said first enlarged conductive layer is an impurity region of one conductivity type formed in a portion of the opposite conductivity type of said substrate.

9. A device of claim 7, in which said second enlarged conductive layer is a polycrystalline silicon plate.

10. A device of claim 7, in which said first voltage is ground potential, and said second voltage is Vcc potential.

11. A device of claim 7, in which said first to third wiring layers and said signal lines are made of same conductive material and formed by a conductive film deposited on an insulating layer through a same process step.

12. A semiconductor memory device comprising a semiconductor substrate, a memory array section positioned in a center portion of said substrate, a peripheral circuit section provided in said substrate and abutted against a first side of said memory array section, a wiring forming area positioned in a peripheral portion of said substrate and abutted against a second side of said memory array section, said second side being extended at right angles with said first side a first power supply wiring layer for supplying a first voltage to said peripheral circuit section and extending on said wiring forming area, a second power supply wiring layer for supplying said first voltage to said memory array section and extending on said memory array section near said second side of said memory array section, a third power supply wiring layer for supplying a second voltage to said peripheral circuit section and/or said memory array section, a MOS type capacitor having a first electrode, a second electrode and a dielectric film between said first and second electrodes, the first electrode being electrically connected to both said first and second power supply wiring layer and said second electrode being electrically connected to said third power supply wiring layer, an insulating layer provided under said first, second and third power supply wiring layers and above said MOS capacitor, and a single line formed on said insulating layer above said MOS capacitor.

13. A semiconductor memory device comprising a semiconductor substrate, a memory array section provided in said substrate, a peripheral circuit section provided in said substrate, a first power supply wiring layer for supplying a first voltage to said peripheral circuit section formed on said substrate, a second power supply wiring layer for supplying said first voltage to said memory array section formed on said substrate and extending in one direction substantially in parallel with said first power supply wiring layer, a third power supply wiring layer for supplying a second voltage to said peripheral circuit section and/or said memory array section formed on said substrate and extending in said one direction between said first and second power supply wiring layers, a first means for electrically connecting said first and second power supply wiring layers each other, positioned under said third power supply wiring layer and having a predetermined area, a conductive part positioned under said third power supply wiring layer, an insulating film positioned between said first means and said conductive part so as to form a capacitor with said first means and said conductive part, a second means for electrically connecting said third power supply wiring layer to said conductive part, and signal lines extending on said substrate between said first and third power supply wiring layers and/or said second and third power supply wiring layers.

14. A semiconductor device comprising a semiconductor substrate, a plurality of circuit elements formed in said substrate, a first power supply wiring layer for supplying a first voltage to one of said circuit elements, said first power supply wiring layer being provided on said substrate, a second power supply wiring layer for supplying said first voltage to another of said circuit elements, said second power supply wiring layer being provided on said substrate and extending in parallel with said first power supply wiring layer, a MOS type capacitor provided on said substrate, said capacitor including a first electrode connected to said first and second power supply wiring layers, a second electrode, and a dielectric film provided between said first and second electrodes, a third power supply wiring layer for supplying a second voltage to one of said circuit element, said third power supply wiring layer being provided on said capacitor and connected to said second electrode of said capacitor, and at least one signal line extending on said capacitor between one of said first and third power supply wiring layers and said second and third power supply wiring layers.

* * * * *